(12) United States Patent
Zhang et al.

(10) Patent No.: US 11,783,738 B2
(45) Date of Patent: Oct. 10, 2023

(54) SPLICED DISPLAY PANEL AND SPLICED DISPLAY APPARATUS

(71) Applicants: BOE MLED Technology Co., Ltd., Beijing (CN); BOE TECHNOLOGY GROUP CO., LTD., Beijing (CN)

(72) Inventors: Gongtao Zhang, Beijing (CN); Haiwei Sun, Beijing (CN); Jian Sang, Beijing (CN); Yezhou Tan, Beijing (CN); Fang Wang, Beijing (CN); Shipeng Wang, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/628,472

(22) PCT Filed: Jan. 21, 2021

(86) PCT No.: PCT/CN2021/073143
§ 371 (c)(1),
(2) Date: Jan. 19, 2022

(87) PCT Pub. No.: WO2021/159942
PCT Pub. Date: Aug. 19, 2021

(65) Prior Publication Data
US 2022/0262285 A1 Aug. 18, 2022

(30) Foreign Application Priority Data
Feb. 11, 2020 (CN) .......................... 202010087794.5

(51) Int. Cl.
*G09G 3/32* (2016.01)
*G09G 3/00* (2006.01)

(52) U.S. Cl.
CPC ............... *G09G 3/001* (2013.01); *G09G 3/32* (2013.01); *G09G 2300/026* (2013.01); *G09G 2300/0404* (2013.01); *G09G 2300/0426* (2013.01)

(58) Field of Classification Search
CPC .......... G06F 3/14; G06F 3/1423–1446; G09G 3/001; G09G 3/32–3291; G09G 2300/02;
(Continued)

(56) References Cited

U.S. PATENT DOCUMENTS

| 8,988,645 B2 * | 3/2015 | Kim ...................... G06F 13/00 349/149 |
| 2005/0134525 A1 * | 6/2005 | Tanghe ................. G06F 3/1446 345/1.1 |

(Continued)

FOREIGN PATENT DOCUMENTS

| CN | 2610436 Y | 4/2004 |
| CN | 202584615 U | 12/2012 |

(Continued)

OTHER PUBLICATIONS

Kang Y. et al., Wide-angle dome-screen projection lens design of laser display, Chinese Journal of Liquid Crystals and Displays, vol. 29 No. 3, Jun. 2014, pp. 333-338, Changchun, China.

(Continued)

*Primary Examiner* — Nathan Danielsen
(74) *Attorney, Agent, or Firm* — IP & T GROUP LLP

(57) ABSTRACT

A spliced display panel includes: a spliced substrate having first openings, spliced screen units disposed on a side of the spliced substrate, electronic devices disposed on a side of the spliced substrate away from the spliced screen units, and circuit components. The spliced screen units are divided into spliced screen unit groups, and each spliced screen unit group includes at least one spliced screen unit. A first (Continued)

opening corresponds to a spliced screen unit group, and exposes a part of a whole of the at least one spliced screen unit in the spliced screen unit group. A circuit component passes through one first opening, an end of the circuit component is electrically connected to a spliced screen unit, and another end thereof is electrically connected to at least one electronic device.

18 Claims, 5 Drawing Sheets

(58) Field of Classification Search
CPC ..... G09G 2300/026; G09G 2300/0404; G09G 2300/0408; G09G 2300/0426; G09G 2310/0281; G09G 2320/02; G09G 2330/02; G09G 2352/00; G09G 2356/00
See application file for complete search history.

(56) References Cited

U.S. PATENT DOCUMENTS

| | | | |
|---|---|---|---|
| 2006/0108915 | A1 | 5/2006 | Cok et al. |
| 2010/0302284 | A1* | 12/2010 | Karaki ................. G09G 5/006 345/1.3 |
| 2011/0267594 | A1 | 11/2011 | Kim et al. |
| 2011/0273906 | A1 | 11/2011 | Nichol et al. |
| 2015/0221712 | A1 | 8/2015 | Yu et al. |
| 2016/0081210 | A1 | 3/2016 | Lv |
| 2016/0238785 | A1 | 8/2016 | Park |
| 2016/0353881 | A1 | 12/2016 | Wang |
| 2017/0075206 | A1 | 3/2017 | McAndrew et al. |
| 2017/0140679 | A1* | 5/2017 | Tomoda ................. G09F 9/3026 |
| 2017/0186345 | A1 | 6/2017 | Hemphill et al. |
| 2019/0277377 | A1 | 9/2019 | Heo et al. |
| 2019/0327827 | A1* | 10/2019 | Chang .................. H05K 5/0021 |
| 2020/0066828 | A1 | 2/2020 | Meersman et al. |
| 2020/0163233 | A1 | 5/2020 | Brackley et al. |
| 2021/0004192 | A1 | 1/2021 | Kamiike |
| 2021/0041718 | A1* | 2/2021 | Balogh .................. H01L 33/58 |
| 2021/0124216 | A1 | 4/2021 | Zhu et al. |
| 2021/0335762 | A1 | 10/2021 | Liu et al. |
| 2021/0358347 | A1 | 11/2021 | Jiang et al. |

FOREIGN PATENT DOCUMENTS

| | | |
|---|---|---|
| CN | 203337938 U | 12/2013 |
| CN | 103745665 A | 4/2014 |
| CN | 103907190 A | 7/2014 |
| CN | 105304002 A | 2/2016 |
| CN | 106030504 A | 10/2016 |
| CN | 106128317 A | 11/2016 |
| CN | 106354950 A | 1/2017 |
| CN | 207039678 U | 2/2018 |
| CN | 108022531 A | 5/2018 |
| CN | 108336124 A | 7/2018 |
| CN | 109613758 A | 4/2019 |
| CN | 109741683 A | 5/2019 |
| CN | 208938557 U | 6/2019 |
| CN | 110246423 A | 9/2019 |
| CN | 110299088 A | 10/2019 |
| CN | 110379314 A | 10/2019 |
| CN | 110379322 A | 10/2019 |
| CN | 209674787 U | 11/2019 |
| CN | 110600494 A | 12/2019 |
| CN | 110914751 A | 3/2020 |
| CN | 111276058 A | 6/2020 |
| JP | 2008-521057 A | 6/2008 |
| JP | 6580294 B1 | 9/2019 |
| KR | 1020160099999 A | 8/2016 |
| WO | 2015127035 A1 | 8/2015 |
| WO | 2018099581 A1 | 6/2018 |

OTHER PUBLICATIONS

Second Office Action for the Chinese Patent Application No. 202010087794.5 issued by the Chinese Patent Office dated Mar. 9, 2022.
First Office Action for the Chinese Patent Application No. 202010087794.5 issued by the Chinese Patent Office dated Jun. 23, 2021.
Bie Y. et al., Design and Realization of LCD Video Splicing Display System, China Computer and Communication, Apr. 2016, pp. 101-102, Hubei, China.
Supplementary Search issued by the Chinese Patent Office for Application No. 2020100877945 dated Feb. 11, 2020.

* cited by examiner

SPLICED DISPLAY PANEL AND SPLICED DISPLAY APPARATUS

CROSS-REFERENCE TO RELATED APPLICATIONS

This application is a national phase entry under 35 USC 371 of International Patent Application No. PCT/CN2021/073143, filed on Jan. 21, 2021, which claims priority to Chinese Application No. 202010087794.5, filed on Feb. 11, 2020, which are incorporated herein by reference in their entirety.

TECHNICAL FIELD

The present disclosure relates to the field of display technologies, and in particular, to a spliced display panel and a spliced display apparatus.

BACKGROUND

Nowadays, spliced display products, especially large-sized seamless spliced display products including light-emitting diode (LED) chips, are more and more popular. The LED chips may include mini LED chips or micro LED chips.

SUMMARY

In an aspect, a spliced display panel is provided. The spliced display panel includes a spliced substrate, a plurality of spliced screen units, a plurality of electronic devices and a plurality of circuit components. The spliced substrate has a plurality of first openings. The plurality of spliced screen units are disposed on a side of the spliced substrate. The plurality of spliced screen units are divided into spliced screen unit groups, and each spliced screen unit group includes at least one spliced screen unit. A first opening of the spliced substrate corresponds to a spliced screen unit group, and exposes a part of a whole of the at least one spliced screen unit in the spliced screen unit group. The plurality of electronic devices are disposed on a side of the spliced substrate away from the plurality of spliced screen units. A circuit component in the plurality of circuit components passes through one first opening, an end of the circuit component is electrically connected to a spliced screen unit, and another end thereof is electrically connected to at least one electronic device.

In some embodiments, the spliced display panel further includes a plurality of first optical alignment marks disposed on a side of the spliced substrate, and at least one second optical alignment mark disposed on a side of each spliced screen unit proximate to the spliced substrate. At least one first optical alignment mark in the plurality of first optical alignment marks is configured to be aligned with the at least one second optical alignment mark on the spliced screen unit in a process of arranging the spliced screen unit in a region where the spliced screen unit is to be arranged.

In some embodiments, at least a portion of the spliced substrate that is provided with the at least one first optical alignment mark thereon is transparent.

In some embodiments, an orthogonal projection of a splice gap between spliced screen units in two adjacent spliced screen unit groups on a plane does not overlap with orthogonal projections of the plurality of first openings on the plane, the plane being perpendicular to a thickness direction of the spliced substrate.

In some embodiments, the plurality of first openings are in one-to-one correspondence with the plurality of spliced screen units. A center line of the first opening substantially coincides with a center line of a corresponding spliced screen unit.

In some embodiments, an orthogonal projection of a splice gap between any two adjacent spliced screen units on a plane does not overlap with orthogonal projections of the plurality of first openings on the plane, the plane being perpendicular to a thickness direction of the spliced substrate.

In some embodiments, the spliced screen unit includes a base substrate, a driving circuit layer disposed on a side of the base substrate away from the spliced substrate, and at least one conductive line. An end of the conductive line is located on a side face of a whole of the base substrate and the driving circuit layer, and is electrically connected to the driving circuit layer of the spliced screen unit. Another end of the conductive line is located on a side of the base substrate away from the driving circuit layer, and is electrically connected to the circuit component.

In some embodiments, the base substrate and/or the spliced substrate are glass substrates.

In some embodiments, the circuit component includes a first flexible printed circuit and a driving circuit device. An end of the first flexible printed circuit is electrically connected to the conductive line(s), and another end thereof is electrically connected to the at least one electronic device. The driving circuit device is disposed on the first flexible printed circuit.

In some embodiments, the circuit component includes a second flexible printed circuit, a third flexible printed circuit, a circuit board connector and driving circuit device(s). An end of the second flexible printed circuit is electrically connected to the conductive line(s), and another end thereof is electrically connected to the circuit board connector. An end of the third flexible printed circuit is electrically connected to the circuit board connector, and another end thereof is electrically connected to the at least one electronic device. At least one of the second flexible printed circuit and the third flexible printed circuit is detachably electrically connected to the circuit board connector, and the driving circuit device(s) are disposed on at least one of the second flexible printed circuit and the third flexible printed circuit.

In some embodiments, in a case where the plurality of first openings are in one-to-one correspondence with the plurality of spliced screen units, four second flexible printed circuits are disposed on a side of each spliced screen unit proximate to the spliced substrate, and each second flexible printed circuit is provided with a driving circuit device thereon; four third flexible printed circuits are correspondingly arranged around each first opening, and each third flexible printed circuit in the four third flexible printed circuits is electrically connected to a respective one of the four second flexible printed circuits through corresponding circuit board connectors; and at least one electronic device is correspondingly arranged on a side, away from the first opening, of each third flexible printed circuit in the four third flexible printed circuits.

In some embodiments, the spliced display panel further includes a circuit layer disposed between the spliced substrate and the plurality of electronic devices. The circuit component is electrically connected to the at least one electronic device through the circuit layer.

In some embodiments, the spliced display panel further includes a plurality of first fixing components disposed between the spliced substrate and the plurality of spliced screen units. The spliced screen unit is fixed to the spliced substrate through at least one first fixing component.

In some embodiments, the spliced display panel further includes a structural frame disposed on a side of the spliced substrate away from the plurality of spliced screen units, and a plurality of second fixing components disposed between the spliced substrate and the structural frame, and fixed to the spliced substrate and the structural frame.

In some embodiments, the structural frame has a plurality of second openings. The plurality of second openings expose the plurality of electronic devices.

In some embodiments, the plurality of first fixing components include at least one of fixing adhesive tapes or magnetic attraction structures. In a case where the spliced display panel includes a plurality of second fixing components, the plurality of second fixing components include at least one of fixing adhesive tapes or magnetic attraction structures.

In some embodiments, the spliced screen unit is a mini light-emitting diode display module or a micro light-emitting diode display module.

In some embodiments, the spliced screen unit has a first actual size and a first preset size. The first actual size is smaller than the first preset size. A difference between the first preset size and the first actual size is a first difference, and the first difference is a sum of a size tolerance of the spliced screen unit and a spliced tolerance of the spliced screen unit.

In some embodiments, the spliced screen unit has a first actual size and a first preset size, and the first actual size is smaller than the first preset size. A difference between the first preset size and the first actual size is a second difference, and the second difference is $(A+2\times B+C)\times 2$. The spliced substrate includes a plurality of spliced sub-substrates that are spliced to one another, and each spliced sub-substrate has a second actual size and a second preset size. The second actual size is smaller than the second preset size. A difference between the second preset size and the second actual size is a third difference, and the third difference is $2\times B$. A is a size tolerance of a single side of the spliced screen unit, B is a size tolerance of a single side of the spliced sub-substrate, and C is an assembly tolerance between the spliced screen unit and the spliced sub-substrate.

In another aspect, a spliced display apparatus is provided. The spliced display apparatus includes the spliced display panel as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products and actual processes of methods involved in the embodiments of the present disclosure.

DETAILED DESCRIPTION

Figure 1:
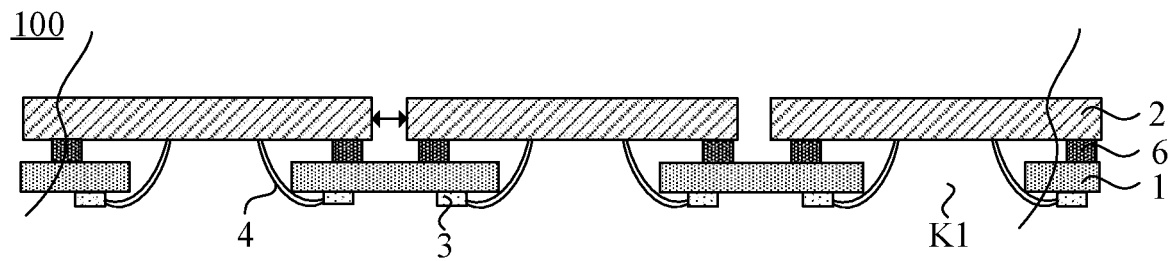
FIG. 1 is a diagram showing a structure of a spliced display panel, in accordance with some embodiments of the present disclosure.
Figure 2:
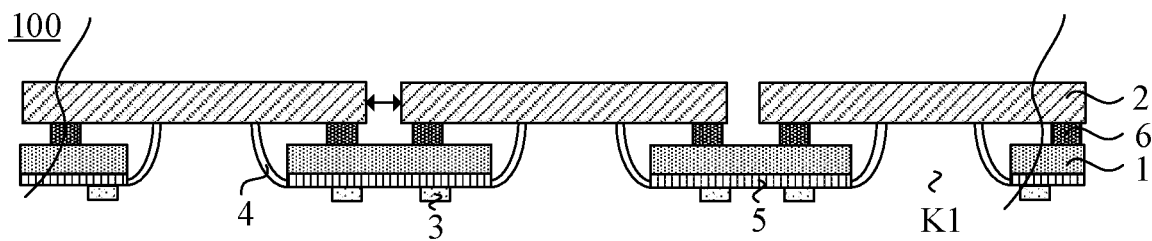
FIG. 2 is a diagram showing a structure of another spliced display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" means two or more unless otherwise specified.

In the description of some embodiments, the term "connected" and its derivatives may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting" depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]" depending on the context.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value. The acceptable range of deviation is determined by a person of ordinary skill in the art in view of measurement in question and error associated with of a particular amount of measurement (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shapes with respect to the accompanying drawings due to, for example, manufacturing technologies and/or tolerances may be envisaged. Therefore, the exemplary embodiments should not be construed to be limited to the shapes of the regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

In the related art, a spliced display product mainly includes a case body, a plurality of hubs, a plurality of sending cards, a plurality of receiving cards, and a plurality of printed circuit boards (PCBs). The case body has a plurality of regions where the PCBs are to be assembled; each hub is provided with a first connector; each PCB is provided with a plurality of light-emitting diode (LED) chips and a second connector, and the plurality of LED chips and the second connector are located on opposite sides of the PCB. The first connector and the second connector may be connected to each other.

In a process of splicing the case body, the hubs and the PCBs, the hubs need to be connected to the plurality of sending cards and the plurality of receiving cards, and the hubs are installed in the plurality of regions, where the PCBs are to be assembled, of the case body, so that the hubs are fixedly connected to the case body; then, the PCBs are arranged in the plurality of regions, where the PCBs are to be assembled, of the case body, so that the second connector of each PCB is connected to the first connector of a hub in a corresponding region where the PCB is to be assembled, the PCBs are fixedly connected to the case body, and splicing of the PCBs is achieved. The plurality of LED chips are located on a side of the PCB away from the hub.

A person skilled in the art may know that in the splicing process, due to complicated splicing actions, the case body, the hubs and the PCBs are spliced manually; as a result, a splicing accuracy of the spliced display product may be reduced. Moreover, a size accuracy of the PCB is low, so that the splicing accuracy of spliced display product may be further reduced, and it is difficult to meet requirements on a splicing accuracy for a high display quality. At present, an actual width of a splice gap of the spliced display product is generally greater than 0.10 mm. A splice gap with a large size may cause a black line to appear at the splice gap of the spliced display product, which affects a display quality.

In addition, with improvement of a display quality of a display product and pixels per inch (PPI), a pitch between two adjacent pixels in the display product is getting smaller and smaller. For example, a P0.9 product (a pitch between two adjacent pixels thereof being approximately 0.9 mm) and a P0.8 product (a pitch between two adjacent pixels thereof being approximately 0.8 mm) have been produced, and a P0.7 (a pitch between two adjacent pixels thereof being approximately 0.7 mm) product and even a P0.5 (a pitch between two adjacent pixels thereof being approximately 0.5 mm) product are also under development. If the width of the splice gap is still approximately 0.10 mm, the display quality of the spliced display product will be seriously affected.

Figure 15:
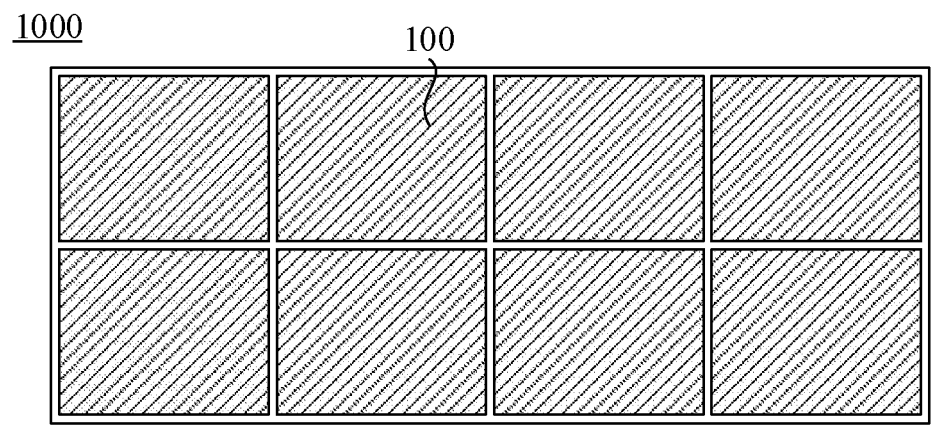
FIG. 15 is a diagram showing a structure of a spliced display apparatus, in accordance with some embodiments of the present disclosure.

Based on this, some embodiments of the present disclosure provide a spliced display panel 100 (as shown in FIGS. 1 to 5) and a spliced display apparatus 1000 (as shown in FIG. 15), which aim to solve the above technical problem.

Technical solutions in the present disclosure and how the technical solutions in the present disclosure solve the above technical problem will be described in detail below with specific embodiments.

Some embodiments of the present disclosure provide the spliced display panel 100. FIGS. 1 to 5 show structures of the spliced display panel 100.

In some embodiments, as shown in FIGS. 1 to 5, the spliced display panel 100 includes a spliced substrate 1, a plurality of spliced screen units 2, a plurality of electronic devices 3, and a plurality of circuit components 4.

Figure 6:
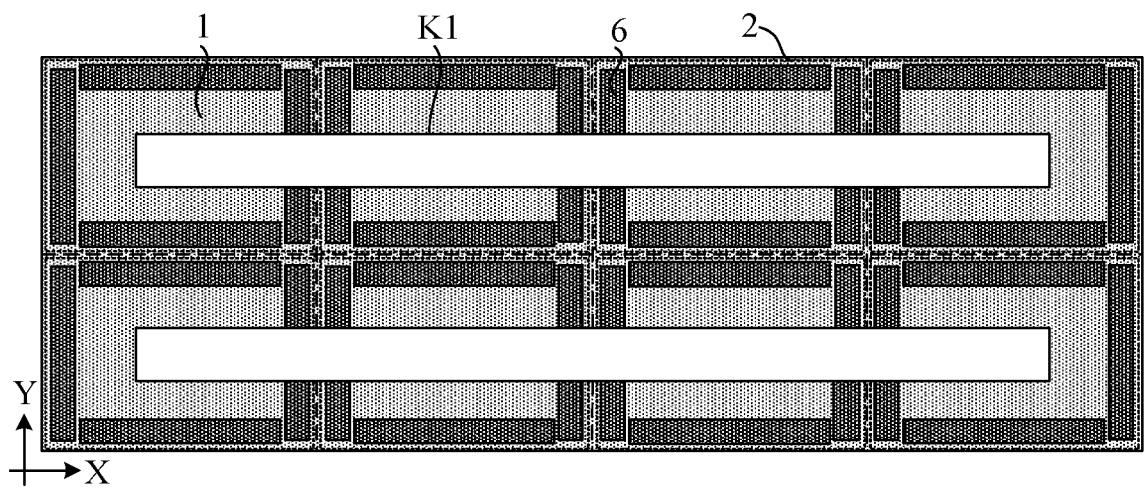
FIG. 6 is a diagram showing a structure of yet another spliced display panel, in accordance with some embodiments of the present disclosure.
Figure 7:
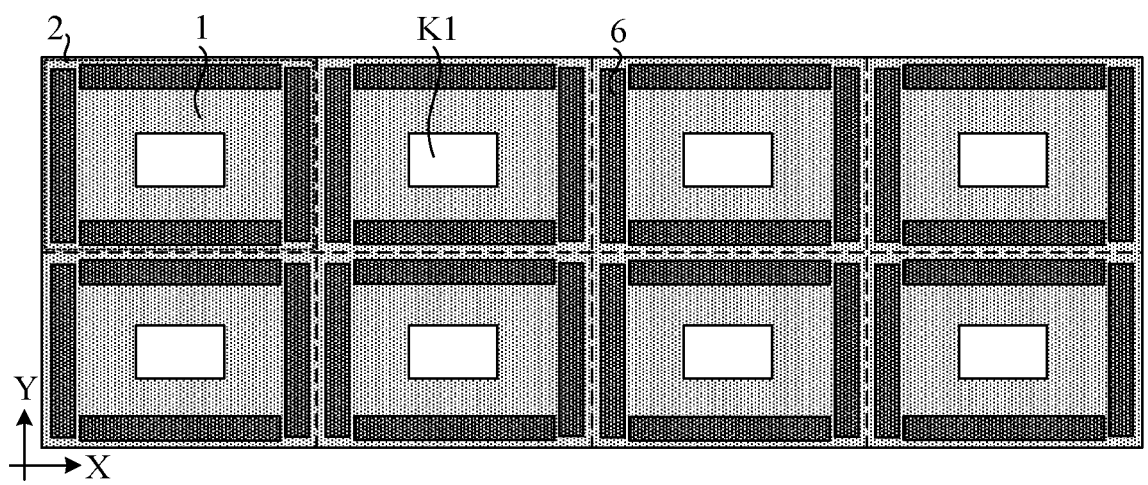
FIG. 7 is a diagram showing a structure of yet another spliced display panel, in accordance with some embodiments of the present disclosure.

In some examples, as shown in FIGS. 1 to 5, the plurality of spliced screen units 2 are disposed on a side of the spliced substrate 1. The plurality of spliced screen units 2 may be arranged, for example, in an array. As shown in FIGS. 6 and 7, the plurality of spliced screen units 2 are arranged in rows in a second direction Y, and are arranged in columns in a first direction X. The first direction X intersects with the second direction Y. For example, the first direction X and the second direction Y may be perpendicular to each other.

For example, the spliced screen units 2 may be mini LED display modules or micro LED display modules. The spliced screen units 2 are capable of displaying images.

In some examples, as shown in FIGS. 1 to 8, the spliced substrate 1 has a plurality of first openings K1.

A shape, a size and an arrangement of the plurality of first openings K1 may be selectively set according to actual needs.

Figure 8:
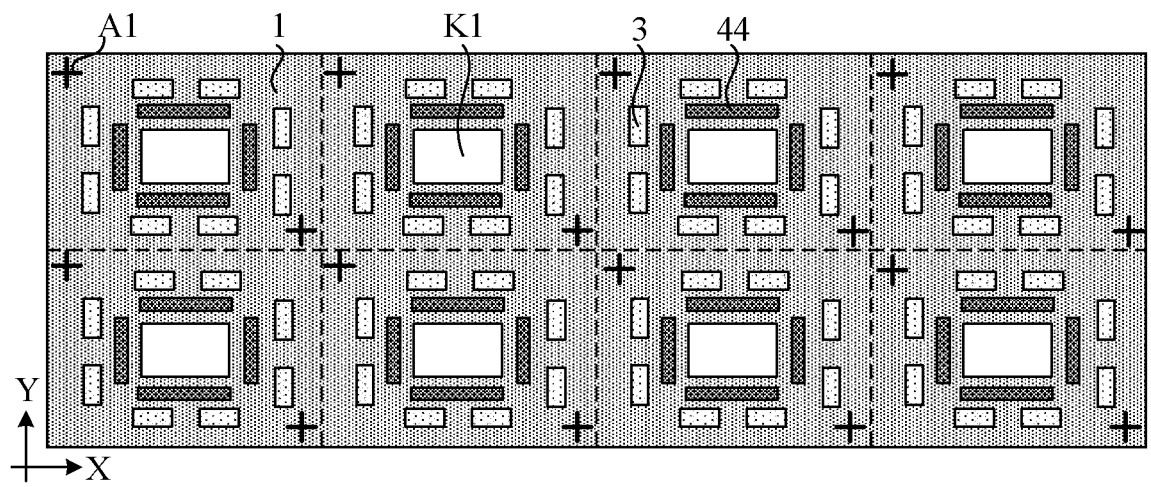
FIG. 8 is a diagram showing a structure of yet another spliced display panel, in accordance with some embodiments of the present disclosure.

For example, as shown in FIGS. 7 and 8, the size of the plurality of first openings K1 is small, and the plurality of first openings K1 may have a quadrangular shape (e.g., a rectangular shape or a square shape). In this case, the plurality of first openings K1 may be arranged, for example, in an array.

For example, as shown in FIG. 6, a dimension of the plurality of first openings K1 in the first direction X is large, and a dimension thereof in the second direction Y is small; and the plurality of first openings K1 may be strip-shaped. In this case, the plurality of first openings K1 may be arranged, for example, in an array; or the plurality of first openings K1 may be sequentially arranged in a line in the second direction Y.

The plurality of spliced screen units are divided into spliced screen unit groups. For example, each spliced screen unit group includes at least one spliced screen unit. That is, the spliced screen unit group may include one or more spliced screen units 2. A first opening K1 of the spliced substrate 1 corresponds to a spliced screen unit group. For example, each first opening K1 corresponds to one spliced screen unit group.

For example, the first opening K1 corresponding to the spliced screen unit group may mean that an orthogonal projection of the spliced screen unit group on a plane partially overlaps with an orthogonal projection of the first opening K1 on the plane, the plane being perpendicular to a thickness direction of the spliced substrate 1. In this case, the first opening K1 may expose a part of a whole of the at least one spliced screen unit 2 in the corresponding spliced screen unit group.

For example, in a case where the spliced screen unit group includes spliced screen units 2, as shown in FIG. 6, the first opening K1 of the spliced substrate 1 corresponds to the spliced screen units 2. The first opening K1 may be strip-shaped and extend in the first direction X, and the first opening K1 may correspond to all or a part of spliced screen units 2 in a corresponding row. The spliced screen unit group includes all or a part of spliced screen units 2 in a row.

An orthogonal projection of a splice gap between spliced screen units 2 in two adjacent spliced screen unit groups on the plane does not overlap with orthogonal projections of the plurality of first openings K1 on the plane. This means that the dimension of the first opening K1 in the second direction Y is smaller than a dimension of corresponding spliced screen unit(s) 2 in the second direction Y, and a portion of the spliced substrate 1 around the first opening K1 may bear at least two opposite sides of the spliced screen unit 2, so as to avoid affecting stability of the spliced screen unit 2.

For example, the first openings K1 of the spliced substrate 1 may also be arranged in a line in the first direction X and extend in the second direction Y, or in an oblique line in a direction that is located in a plane defined by the first direction X and the second direction Y and intersects with the first direction X and the second direction Y.

For example, in a case where the spliced screen unit group includes one spliced screen unit 2, as shown in FIGS. 7 and 8, the plurality of first openings K1 of the spliced substrate 1 are in one-to-one correspondence with the plurality of spliced screen units 2, and a center line, parallel to the thickness direction of the spliced substrate 1, of each first opening K1 coincides or substantially coincides with a center line, parallel to the thickness direction of the spliced substrate 1, of a corresponding spliced screen unit 2.

By arranging the plurality of first openings K1 of the spliced substrate 1 in one-to-one correspondence with the plurality of spliced screen units 2, it may be possible to facilitate to reduce the size of a single first opening K1, and to reduce a large strength loss of the spliced substrate 1 caused by the arrangement of the plurality of first openings K1, on a premise of ensuring that the circuit components 4 disposed on a side of the spliced screen units 2 proximate to the spliced substrate 1 easily pass through respective first openings K1.

In this example, since the center line of each first opening K1 coincides or substantially coincides with the center line of the corresponding spliced screen unit 2, it may be possible to facilitate alignment between the circuit component 4 and the first opening K1. In addition, it may be possible to facilitate to balance lengths of lines, connected to interfaces in different directions in the spliced screen unit 2, of the circuit component 4 as much as possible, to facilitate modular production of the circuit components 4, and to facilitate to reduce costs. For the circuit component 4, reference may be made to the following description, and details will not be repeated here.

The first openings K1 have, for example, the quadrangular shape. The size of the first openings K1 is small. In a process of cutting a spliced base to form the first openings K1 and obtain the spliced substrate 1, only a small part of the spliced base is removed, and a large part of the spliced base is remained, so that the spliced substrate 1 may have a high strength.

Here, an area of an orthogonal projection of the spliced screen unit 2 on the plane is larger than an area of an orthogonal projection of the corresponding first opening K1 on the plane, and the orthogonal projection of the corresponding first opening K1 on the plane is located within the orthogonal projection of the spliced screen unit 2 on the plane. That is, an orthogonal projection of a splice gap between any two adjacent spliced screen units 2 on the plane is not overlapped with orthogonal projections of all first openings K1 of the spliced substrate 1 on the plane. In this way, it may be possible to ensure that the portion of the spliced substrate 1 around the first opening K1 may bear a periphery of the spliced screen unit 2, and to avoid affecting the stability of the spliced screen unit 2.

In some embodiments, the first openings K1 of the spliced substrate 1 may be formed by cutting the spliced base through laser ablation or computer numerical control (CNC) grinding. In this way, the spliced substrate 1 may have a high size accuracy, and after the plurality of spliced screen units 2 are disposed on the side of the spliced substrate 1, a width of the splice gap between two adjacent spliced screen units 2 may be small, and a splicing accuracy may be improved.

In some examples, as shown in FIGS. 1 to 5, the plurality of electronic devices 3 are disposed on a side of the spliced substrate 1 away from the plurality of spliced screen units 2.

That is, the electronic devices 3 and the spliced screen units 2 are on two opposite sides of the spliced substrate 1.

A structure of the electronic device 3 may be various. In some examples, the electronic device 3 may include, but are not limited to, a field programmable gate array (FPGA), a direct current to direct current (DCDC) converter, a storage device or a connector.

For example, the electronic devices 3 may be disposed on the side of the spliced substrate 1 away from the plurality of spliced screen units 2 by using surface-mount technology (SMT). SMT is a circuit mounting technology in which surface-mounted components/surface-mounted devices (abbreviated as SMCs/SMDs) with no pins or short leads are mounted on a surface of a PCB or a substrate, and then soldered through reflow soldering or dip soldering.

In some examples, as shown in FIGS. 1 to 5, a circuit component 4 in the plurality of circuit components 4 passes through one first opening K1, an end of the circuit component 4 is electrically connected to a spliced screen unit 2, and another end of the circuit component 4 is electrically connected to at least one electronic device 3. In this way, the circuit component 4 and the electronic device(s) 3 may drive the spliced screen unit 2 to display images.

The number of circuit component(s) 4 electrically connected to the same spliced screen unit 2 and the number of electronic device(s) 3 electrically connected to the same circuit component 4 may be selectively set according to actual needs. For example, the spliced screen units 2 and the first openings K1 are arranged in one-to-one correspondence, and there are two circuit components 4 electrically connected to the same spliced screen unit 2. In this case, the two circuit components 4 both pass through a corresponding first opening K1 to be electrically connected to the spliced screen unit 2 and electronic devices 3. Of course, for the circuit components 4, each circuit component 4 passes through a corresponding first opening to be electrically connected to the spliced screen unit 2 and electronic device(s) 3.

It will be noted that, in the embodiments of the present disclosure, the plurality of spliced screen units 2 are disposed on a side of the spliced substrate 1, the plurality of electronic devices 3 are disposed on an opposite side of the spliced substrate 1 by using SMT, and the plurality of spliced screen units 2 and the plurality of electronic devices 3 are connected through the plurality of circuit components. Therefore, it may be possible to replace the plurality of PCBs, the plurality of hubs, the plurality of receiving cards, and the plurality of sending cards in the related art.

Therefore, in the spliced display panel 100 provided in some embodiments of the present disclosure, since the spliced substrate 1 has the high size accuracy, it may provide a unified high-accuracy splicing platform for splicing of the plurality of spliced screen units 2. In this way, the spliced screen units 2 may be spliced using the high-accuracy splicing platform as a reference, so that the splicing accuracy of the spliced display panel 100 is greatly improved compared to the related art.

Moreover, in the spliced display panel 100 provided in the embodiments of the present disclosure, splicing actions may be divided into at least two sequential actions including fixed connection and electrical connection. The fixed connection action includes fixed connection between the spliced screen units 2 and the spliced substrate 1 after alignment between the spliced screen units 2 and the spliced substrate 1 is completed. The electrical connection action includes electrical connection between the circuit component 4 and both corresponding electronic device(s) 3 and the spliced screen unit 2 after the circuit component 4 on the side of the spliced screen unit 2 proximate to the spliced substrate 1 pass through the first opening K1 of the spliced substrate 1. In this way, there is no need to simultaneously perform the electrical connection action in a process of performing the alignment and fixed connection action, so that the splicing actions may be completed by a machine. Compared to the related art in which the above two actions are performed simultaneously, the splicing accuracy of the spliced display panel 100 in the embodiments of the present disclosure is greatly improved. It has been verified that, the width of the splice gap between the plurality of spliced screen units 2 in the spliced display panel 100 is less than or equal to 10 μm. Compared to the related art, the width of the splice gap is improved by an order of magnitude in accuracy.

Figure 9:
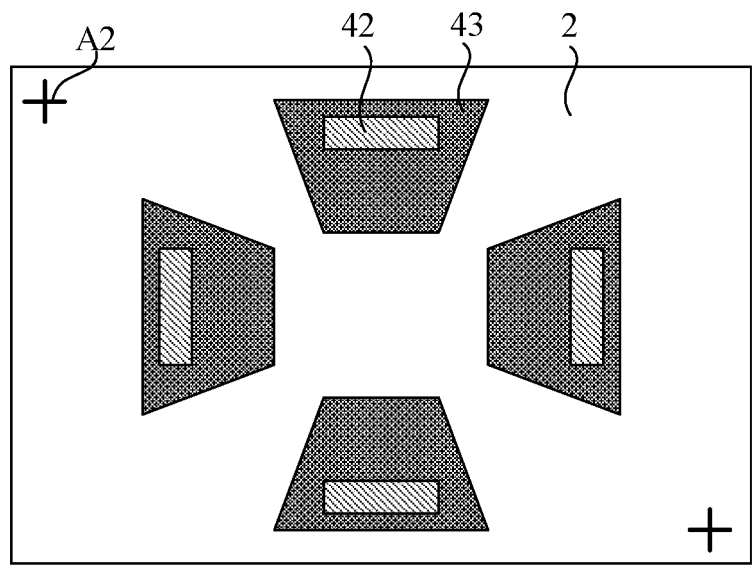
FIG. 9 is a diagram showing a structure of yet another spliced display panel, in accordance with some embodiments of the present disclosure.

In some embodiments, as shown in FIGS. 8 and 9, the spliced display panel 100 further includes a plurality of first optical alignment marks A1 disposed on a side of the spliced substrate 1, and at least one second optical alignment mark A2 disposed on a side of each spliced screen unit 2 proximate to the spliced substrate 1. At least one first optical alignment mark A1 in the plurality of first optical alignment marks A1 is configured to be aligned with the at least one second optical alignment mark A2 on the spliced screen unit 2 in a process of arranging the spliced screen unit 2 in a region where the spliced screen unit 2 is to be arranged.

The at least one first optical alignment mark A1 being aligned with the at least one second optical alignment mark A2 may mean that, in a process of arranging the spliced screen unit 2 in the region where the spliced screen unit 2 is to be arranged by using a high-accuracy equipment, the first optical alignment mark A1 and a corresponding second optical alignment mark A2 are aligned; then, the first optical alignment mark A1 and the corresponding second optical alignment mark A2 are optically focused, so that a center of the first optical alignment mark A1 coincides or substantially coincides with a center of the corresponding second optical alignment mark A2; and after that, the spliced screen unit 2 is assembled on the spliced substrate 1. In this way, the spliced screen unit 2 is exactly in the region where the spliced screen unit 2 to be arranged.

In these embodiments, the first optical alignment mark A1 may be disposed on a side of the spliced substrate 1 proximate to the spliced screen units 2. Of course, the first optical alignment mark A1 may also be disposed on a side of the spliced substrate 1 away from the spliced screen units 2.

It will be noted that, in a process of optically focusing the first optical alignment mark A1 and the corresponding second optical alignment mark A2, a structure (i.e., the spliced substrate 1 or the display screen unit 2) proximate to a focusing device needs to be at least partially transparent. Considering that the display screen unit 2 is used for displaying images, if a part of the display screen unit 2 is set to be transparent, a display effect of the display screen unit 2 will be easily affected. Therefore, at least a portion of the spliced substrate 1 that is provided with the first optical alignment mark A1 thereon is transparent. In this way, the optical focusing may be performed from the side of the spliced substrate 1 away from the spliced screen units 2, and it may also be possible to facilitate recognition of the first optical alignment mark A1 and the corresponding second optical alignment mark A2 by the focusing device of the high-accuracy equipment, and in turn to achieve accurate alignment of the spliced substrate 1 and the spliced screen unit 2.

Here, for example, only the portion of the spliced substrate 1 that is provided with the first optical alignment mark A1 thereon is transparent. For another example, the spliced substrate 1 is transparent.

In a case where the spliced substrate 1 is transparent, the spliced substrate 1 may be made of glass. That is, the spliced substrate 1 may be a glass substrate, which facilitates to achieve high-accuracy attachment, so as to improve the splicing accuracy. A thickness of the glass substrate is, for example, approximately 1.0 mm, and a size thereof (i.e., dimensions in directions perpendicular to a thickness direction thereof) may be determined based on specific conditions. For example, in a certain application scene where there are n by m (n×m) spliced screen units 2 need to be assembled, the size of the spliced substrate 1 may be directly customized (if the size is excessively large, the spliced substrate 1 may be obtained by splicing a plurality of spliced sub-substrates), and then corresponding spliced screen units 2, electronic devices 3, and circuit components 4 are assembled on the spliced substrate 1.

In some examples, the first optical alignment mark A1 may be obtained by development and exposure at a certain corner of a region of the spliced substrate 1, the region of the spliced substrate 1 being used for arranging a spliced screen unit 2 thereon. For example, two first optical alignment marks A1 are provided on each region of the spliced substrate 1 where a spliced screen unit 2 is to be arranged.

In some examples, the second optical alignment mark A2 may also be obtained by development and exposure on the side of the spliced screen unit 2 proximate to the spliced substrate 1. Each spliced screen unit 2 may be provided with two second optical alignment marks A2 thereon, and positions of the two second optical alignment marks A2 correspond to positions of the two first optical alignment marks A1 on a region of the spliced substrate 1 where a spliced screen unit 2 is to be arranged.

In this way, it may be possible to facilitate to assemble the spliced screen units 2 on the spliced substrate 1 through the optical focusing by using the high-accuracy equipment, and thus high-accuracy splicing of the spliced screen units 2 is achieved. For example, the splicing accuracy of the spliced screen units 2 is less than or equal to 10 μm.

Figure 10:
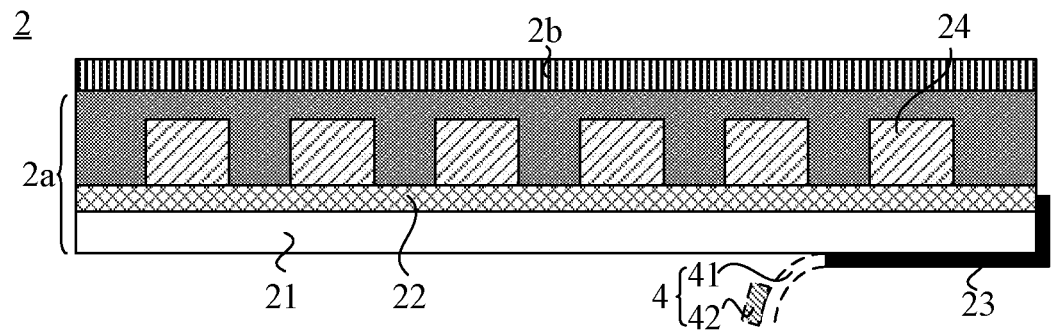
FIG. 10 is a diagram showing a structure of a spliced screen unit, in accordance with some embodiments of the present disclosure.

In some embodiments, the wiring of the spliced screen units 2 may be regulated to match the high-accuracy splicing. Based on this, as shown in FIG. 10, the spliced screen unit 2 may include a base substrate 21, a driving circuit layer 22 and at least one conductive line 23. Of course, the spliced screen unit 2 may further include a plurality of LED chips (e.g., mini LED chips or micro LED chips) 24.

In some examples, the base substrate 21 may be, for example, a glass substrate. The base substrate 21 has a high size accuracy, so that the display screen unit 2 itself may have a high size accuracy.

In some examples, as shown in FIG. 10, the driving circuit layer 22 is disposed on a side of the base substrate 21, and the side of the base substrate 21 is a side thereof away from the spliced substrate 1 after the display screen unit 2 and the spliced substrate 1 are assembled. The plurality of LED chips 24 are disposed on a side of the driving circuit layer 22 away from the base substrate 21, and are electrically connected to the driving circuit layer 22. The driving circuit layer 22 is capable of transmitting driving signals to the plurality of LED chips 24, so that the plurality of LED chips 24 emit light.

In some examples, as shown in FIG. 10, an end of each conductive line 23 is located on a side face of a whole of the base substrate 21 and the driving circuit layer 22, and is electrically connected to the driving circuit layer 22 of the spliced screen unit 2. Another end of the conductive line 23 is located on a side of the base substrate 21 away from the driving circuit layer 22, and is electrically connected to the circuit component 4. In this case, the circuit component 4 is capable of generating driving signals, which are transmitted to the driving circuit layer 22 through the conductive line 23, so as to drive the LED chips 24 to emit light.

For example, the conductive line 23 includes, but is not limited to, a power supply line and a signal line.

In these examples, the end of the conductive line 23 of the spliced screen unit 2 is located on the side face of the whole of the base substrate 21 and the driving circuit layer 22 to adapt to a stacked structure of the spliced screen unit 2. The another end of the conductive line 23 of the spliced screen unit 2 is located on the side of the base substrate 21 away from the driving circuit layer 22, so as to facilitate alignment of the spliced screen unit 2 and the first opening K1 in the spliced substrate 1 and electrical connection between the conductive line 23 and the circuit component 4.

In some embodiments, as shown in FIG. 10, the spliced screen unit 2 may include an array substrate 2a and a color filter (CF) substrate 2b. The array substrate 2a may include the base substrate 21, the driving circuit layer 22, the conductive line(s) 23 and the LED chips 24. The CF substrate 2b may include a CF layer (e.g., including blue color resistors, red color resistors and green color resistors), a black matrix (BM), and a CF glass substrate with banks. The BM is used to block a non-light-emitting region to emit light, so as to improve contrast; the banks may improve light efficiency; and the CF glass substrate may be replaced with a transparent adhesive structure.

A structure of the circuit component 4 may be various, which may be selectively set according to actual needs.

In some embodiments, as shown in FIG. 10, the circuit component 4 includes a first flexible printed circuit (FPC) 41 and driving circuit device(s) 42. An end of the first FPC 41 is electrically connected to the conductive line(s) 23, and another end thereof is electrically connected to the electronic device(s) 3. The driving circuit device(s) 42 are disposed on the first FPC 41.

For example, the driving circuit device 42 may be a driver integrated circuit (IC).

In these embodiments, the first FPC 41 used in the circuit component 4 is suitable for a narrow installation space due to its excellent characteristics such as light weight, small thickness, and free bending and folding. Since the driving circuit device 42 is arranged on the first FPC 41, it may achieve driving control of each spliced screen unit 2.

Figure 12:
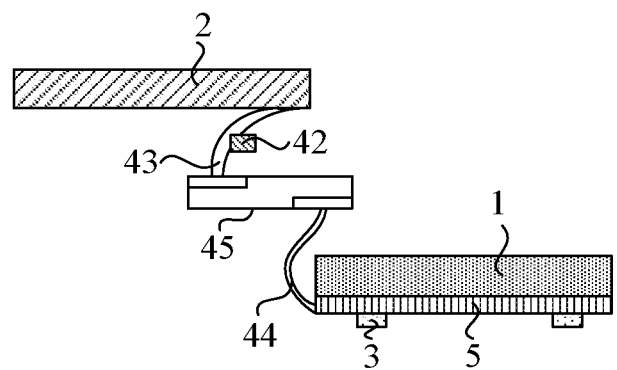
FIG. 12 is a diagram showing a structure of a circuit component, in accordance with some embodiments of the present disclosure.

In some other embodiments, as shown in FIG. 12, the circuit component 4 includes a second FPC 43, a third FPC 44, a circuit board connector 45 and driving circuit device(s) 42.

Figure 11:
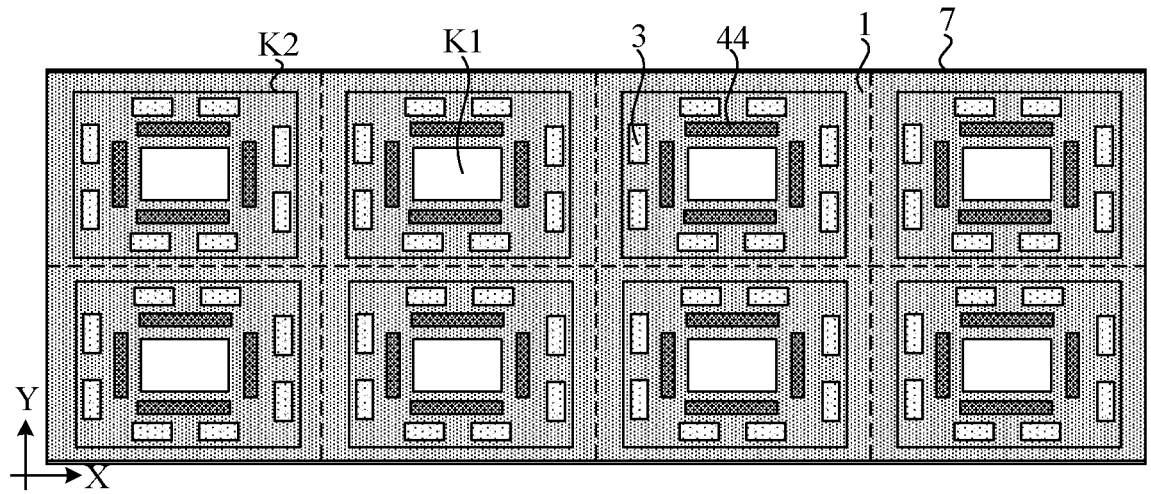
FIG. 11 is a diagram showing a structure of yet another spliced display panel, in accordance with some embodiments of the present disclosure.

In some examples, as shown in FIGS. 9, 11 and 12, an end of the second FPC 43 is electrically connected to the conductive line(s) 23, and another end thereof is electrically connected to the circuit board connector 45. An end of the third FPC 44 is electrically connected to the circuit board connector 45, and another terminal thereof is electrically connected to the electronic device(s) 3. At least one of the second FPC 43 and the third FPC 44 is detachably electrically connected to the circuit board connector 45. The driving circuit device(s) 42 are disposed on at least one of the second flexible printed circuit 43 and the third flexible printed circuit 44. The driving circuit device 42 may be a driver device or a driver IC.

A primary structure and a principle of the spliced display panel 100 in these embodiments are the same as those structures and principles of the spliced display panel 100 described in the above embodiments. A difference is that the circuit component 4 in the spliced display panel 100 provided in these embodiments adopts two FPCs including the second FPC 43 and the third FPC 44, and the second FPC 43 is connected to the third FPC 44 through the circuit board connector 45, so as to achieve a detachable flexible connection between the two FPCs.

In some possible implementations, the second FPC 43 may be fixedly electrically connected to the conductive line(s) 23 of the spliced screen unit 2. That is, the second FPC 43 is integrated onto the spliced screen unit 2. In a process of splicing the spliced screen units 2, the second FPC 43 passes through the first opening K1 in the spliced substrate 1. In a process in which the spliced screen unit 2 is electrically connected to the electronic device(s) 3, the second FPC 43 is electrically connected to the circuit board connector 45.

In some possible implementations, the third FPC 44 may be fixedly electrically connected to the circuit board connector 45, and a whole constituted by the third FPC 44 and the circuit board connector 45 is electrically connected to the electronic device(s) 3, so as to subsequent cooperate with the second FPC 43, thereby achieving the electrical connection between the spliced screen unit 2 and the electronic device(s) 3.

In some examples, in a case where the first openings K1 are in one-to-one correspondence with the spliced screen units 2, as shown in FIGS. 9 and 11, four second FPCs 43 may be disposed on a side of each spliced screen unit 2 proximate to the spliced substrate 1, and each second FPC 43 is provided with a driving circuit device 42 thereon. Four third FPCs 44 are correspondingly arranged around each first opening K1, and the four third FPCs 44 are electrically connected to the four second FPCs 43 through corresponding circuit board connectors 45, respectively. At least one electronic device 3 is correspondingly arranged on a side, away from the first opening K1, of each third FPC 44 in the four FPCs 44.

For example, each first opening K1 has the rectangular shape. In this case, each third FPC 44 in the four third FPCs 44 is opposite to a side of the first opening K1.

Since each third FPC 44 is correspondingly connected to one second FPC 43, the four second FPCs 43 may be disposed on the side of each spliced screen unit 2 proximate to the spliced substrate 1. Positions of the four second FPCs 43 correspond to positions of the four third FPCs 44, and thus it is possible to avoid crossovers of FPCs during the electrical connection between the third FPCs 44 and respective second FPCs 43.

The electronic devices 3 connected to the spliced screen unit 2 are divided into four groups, and each group of electronic devices 3 may correspond to one side of the first opening K1. In this way, it is possible to avoid crossovers of the FPCs during the electrical connection between the third FPCs 44 and respective electronic devices 3.

In some embodiments, as shown in FIGS. 2 to 5, the spliced display panel 100 further includes a circuit layer 5 disposed between the spliced substrate 1 and the plurality of electronic devices 3. Each circuit component 4 is electrically connected to corresponding electronic device(s) 3 through the circuit layer 5.

In some examples, the circuit layer 5 is composed of a plurality of circuits. The plurality of electronic devices 3 may be electrically connected to the plurality of circuit components 4 through the plurality of circuits in the circuit layer 5, and each circuit component 4 may be electrically connected to the corresponding electronic device(s) 3 through the circuit layer 5.

Figure 4:
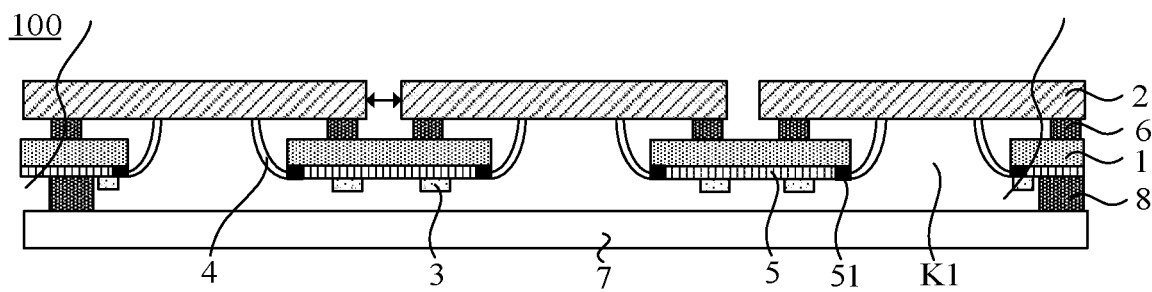
FIG. 4 is a diagram showing a structure of yet another spliced display panel, in accordance with some embodiments of the present disclosure.
Figure 5:
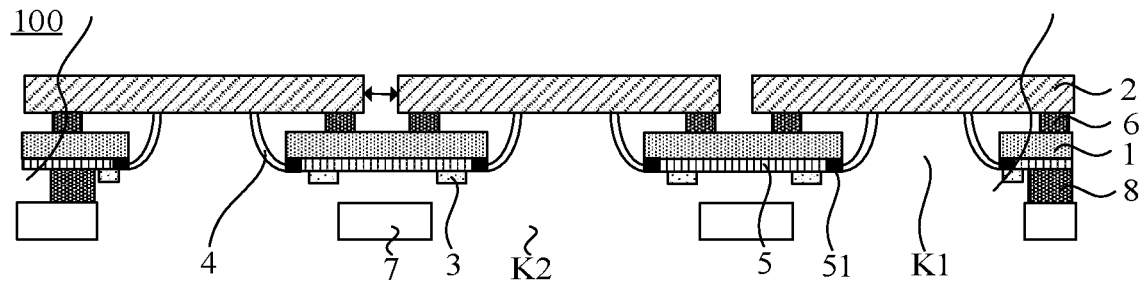
FIG. 5 is a diagram showing a structure of yet another spliced display panel, in accordance with some embodiments of the present disclosure.

In some embodiments, as shown in FIGS. 4 and 5, the spliced display panel 100 may further include circuit layer connectors 51 disposed at positions where the circuit layer 5 is electrically connected to circuit components 4. Therefore, it may achieve plug-in electrical connection between the circuit component 4 and the circuit layer 5, which makes an assembly process more convenient.

In some embodiments, as shown in FIGS. 1 to 5, the spliced display panel 100 further includes a plurality of first fixing components 6. The plurality of first fixing components 6 are all fixedly disposed on the same side of the spliced substrate 1, and are located between the spliced substrate 1 and the plurality of spliced screen units 2. Each spliced screen unit 2 is fixed to the spliced substrate 1 through at least one first fixing component 6.

In some examples, each spliced screen unit 2 may be fixed to the spliced substrate 1 through one first fixing component 6. The first fixing component 6 may be, for example, loop-shaped, so that the spliced screen unit 2 is stably fixed on the spliced substrate 1 through the first fixing component 6.

In some other examples, as shown in FIGS. 6 and 7, each spliced screen unit 2 may be fixed to the spliced substrate 1 through first fixing components 6. The first fixing components 6 may be, for example, spaced apart and sequentially arranged in a circle, so that the spliced screen unit 2 is stably fixed on the spliced substrate 1 through the first fixing components 6.

For example, the first fixing component 6 may be a fixing adhesive tape. The fixing adhesive tape may be arranged in a loop shape to provide a stable fixed connection for the spliced screen unit 2. The fixing adhesive tape may be a double-sided adhesive tape.

For example, the first fixing component 6 may also be a magnetic attraction structure to facilitate disassembly of the spliced screen unit 2.

Figure 3:
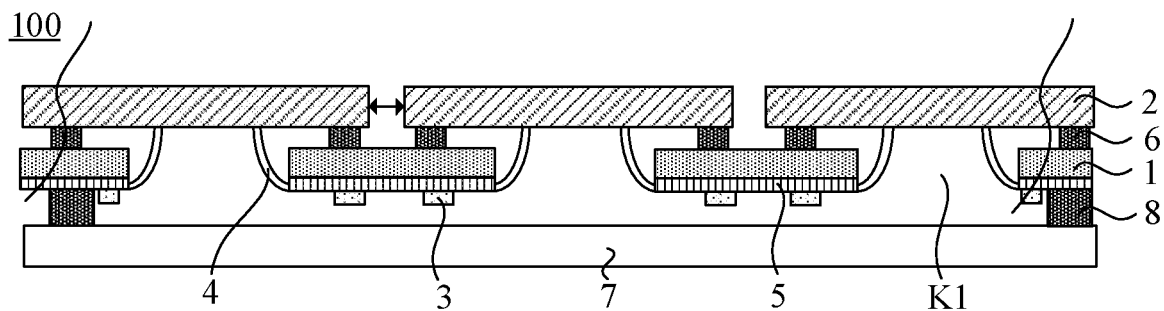
FIG. 3 is a diagram showing a structure of yet another spliced display panel, in accordance with some embodiments of the present disclosure.

In some embodiments, as shown in FIGS. 3 to 5, the spliced display panel 100 further includes second fixing components 8 and a structural frame 7.

In some examples, as shown in FIGS. 3 to 5, the structural frame 7 is disposed at a side of the spliced substrate 1 away from the spliced screen units 2. The second fixing components 8 are disposed between the spliced substrate 1 and the structural frame 7, and the second fixing components 8 are fixed to the spliced substrate 1 and the structural frame 7.

In these embodiments, the spliced substrate 1 on which the spliced screen units 2 are completely spliced may be fixedly connected to the structural frame 7 through the second fixing components 8, which facilitates to obtain the spliced display panel 100 through assembly. The structural frame 7 may provide strong support for structures assembled on the structural frame 7, and may also protect the spliced screen units 2 and the circuit layer 5.

In some examples, as shown in FIG. 5, the structural frame 7 has a plurality of second openings K2. The plurality of second openings K2 expose the plurality of electronic devices 3.

For example, as shown in FIG. 11, a center line of a second opening K2 coincides or substantially coincides with a center line of a corresponding first opening K1, and a size of the second opening K2 is greater than a size of the first opening K1. In this way, it is conducive to ensuring that the structural frame 7 does not block the plurality of electronic devices 3.

The structural frame 7 is provided with the plurality of second openings K2 therein, so that the plurality of electronic devices 3 may be avoided through the plurality of second openings K2, which may prevent the plurality of electronic devices 3 from being damaged due to compression in a case where a gap between the structural frame 7 and the spliced substrate 1 is small. In addition, by providing the plurality of second openings K2 in the structural frame 7, it may be possible to facilitate to maintain the spliced screen units 2, the electronic devices 3, and the circuit components 4 through the plurality of second openings K2.

For example, the second fixing component 8 may be a fixing adhesive tape. The fixing adhesive tape is arranged in a loop shape, and is located on an edge of the structural frame 7. In this way, an edge of the spliced substrate 1 may be connected to the edge of the structural frame 7 by using the second fixing component 8, thereby providing stable fixed connections for the spliced substrate 1 and the spliced screen units 2.

For example, the second fixing component 8 may also be a magnetic attraction structure, which facilitates disassembly of a whole constituted by the spliced screen units 2 and the spliced substrate 1 from the structural frame 7.

Figure 13:
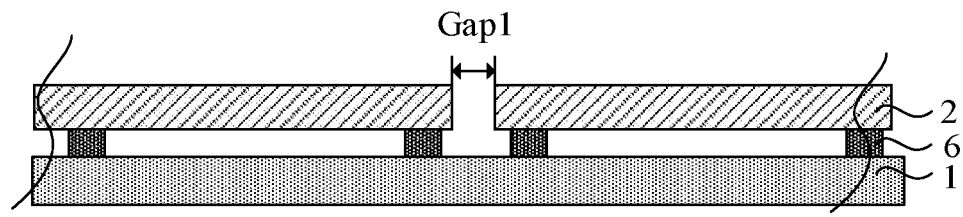
FIG. 13 is a diagram showing a structure of yet another spliced display panel, in accordance with some embodiments of the present disclosure.

In a case where one spliced substrate 1 is used in the spliced display panel 100, in order to meet a high-accuracy splicing requirement, there is a need to pay attention to reasonable adjustment of a size of each spliced screen unit 2 when it is manufactured. Based on this, in some embodiments, as shown in FIG. 13, the spliced screen unit 2 has a first actual size and a first preset size. The first actual size is less than the first preset size, and a difference between the first preset size and the first actual size is a first difference. The first difference is a sum of a size tolerance of the spliced screen unit 2 and a spliced tolerance of the spliced screen unit 2. The spliced tolerance of the spliced screen unit 2 is a tolerance of a splice gap between the spliced screen unit 2 and another spliced screen unit 2 that are spliced.

For example, the size tolerance of the spliced screen unit 2 is 40 µm, the spliced tolerance of the spliced screen unit 2 is 10 µm, and thus a design value of a splice gap Gap1 between two adjacent spliced screen units 2 is approximately 50 µm. In order to ensure that a deviation of a distance between two adjacent pixels at the splice gap (the two pixels being located in the two adjacent spliced screen units 2) is less than 10 µm, the first actual size of the spliced screen unit 2 needs to be 50 µm smaller than the first preset size thereof. A width of the splice gap is in a range of 0 mm to 0.10 mm, inclusive, and the deviation of the distance between the two adjacent pixels at the splice gap is in a range of −0.01 mm to 0.01 mm, inclusive.

Figure 14:
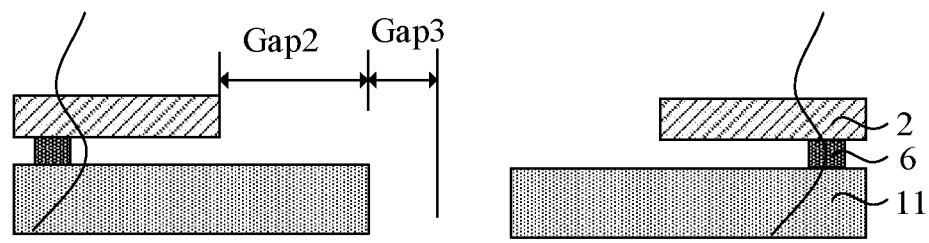
FIG. 14 is a diagram showing a structure of yet another spliced display panel, in accordance with some embodiments of the present disclosure.

In a case where a size of the spliced display panel 100 is excessively large, and a plurality of spliced sub-substrates need to be spliced to obtain the spliced substrate 1, in order to meet the high-accuracy splicing requirement, not only the size of each spliced screen unit 2 but also a size of each spliced sub-substrate needs to be reasonably adjusted. Based on this, in some embodiments, as shown in FIG. 14, the spliced screen unit 2 has a first actual size and a first preset size. The first actual size of the spliced screen unit 2 is smaller than the first preset size thereof, and a difference between the first preset size and the first actual size is a second difference. The second difference is (A+2×B+C)×2, that is, it is twice Gap2, Gap2 representing a distance between a side of the spliced screen unit 2 and a corresponding side of the spliced sub-substrate 11.

The spliced substrate 1 includes a plurality of spliced sub-substrates 11 that are spliced to each other, and each spliced sub-substrate 11 has a second actual size and a second preset size. The second actual size of the spliced sub-substrate 11 is smaller than the second preset size thereof, and a difference between the second preset size and the second actual size is a third difference. The third difference is 2×B, that is, it is twice Gap3, Gap3 representing a half of a distance between two adjacent spliced to sub-substrates 11.

A is a size tolerance of a single side of the spliced screen unit 2, B is a size tolerance of a single side of the spliced sub-substrate 110, and C is an assembly tolerance between the spliced screen unit 2 and the spliced sub-substrate 11.

In this implementation, in order to ensure that a gap between two adjacent pixels at a splice gap is small, a first actual size of the spliced screen unit 2 and a second actual size of the spliced sub-substrate 11 both need to be smaller than their respective preset sizes.

Some embodiments of the present disclosure provide the spliced display apparatus 1000. As shown in FIG. 15, the spliced display apparatus 1000 includes the spliced display panel 100 as described in any of the above embodiments.

The spliced display panel 100 in the spliced display apparatus 1000 is the spliced display panel 100 provided in the above embodiments. For a principle and technical effects of the spliced display apparatus 1000, reference may be made to those of the spliced display panel 100 described in the above embodiments, and details will not be repeated here.

Some embodiments of the present disclosure provide a method for manufacturing a spliced display panel, and a specific process of the method is as followings.

In S1, as shown in FIGS. 1 to 7, a circuit layer 5 and first optical alignment marks A1 are formed on a surface of a spliced substrate 1 by means of deposition and patterning including exposure and development.

In S2, the spliced substrate 1 is cut to form first openings K1 by means of laser or CNC grinding; and an outer contour of the spliced substrate 1 may also be ground by means of laser or CNC grinding.

In S3, electronic devices 3 are disposed on a side of the spliced substrate 1 on which the circuit layer 5 has been formed; and then, third FPCs 44 in circuit components 4 are disposed, so that the third FPCs 44 are connected to the electronic devices 3 through the circuit layer 5.

In S4, first fixing components 6 (i.e., double-sided adhesive tapes or magnetic attraction structures) are arranged on a side of the spliced substrate 1 away from the circuit layer 5.

In S5, second optical alignment mark(s) A2 on each spliced screen unit 2 are captured through a high-accuracy equipment, and are focused with corresponding first optical alignment mark(s) A1 on the spliced substrate 1, so that the spliced screen unit 2 is assembled on the spliced substrate 1 through alignment between the first optical alignment mark(s) A1 and the second optical alignment mark(s) A2, and is fixedly connected to the spliced substrate 1 through first fixing component(s) 6. Afterwards, remaining spliced screen units 2 are subsequently assembled on the spliced substrate 1 in the same way.

In S6, second FPCs 43 located on a side of the spliced screen units 2 proximate to the spliced base 1 are electrically connected to the third FPCs 44 through circuit board connectors 45.

In S7, the spliced substrate 1 is fixed to a structural frame 7 through second fixing components 8.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A spliced display panel, comprising:
   a spliced substrate having a plurality of first openings;
   a plurality of spliced screen units disposed on a side of the spliced substrate, wherein the plurality of spliced screen units is divided into spliced screen unit groups, and each spliced screen unit group includes at least one spliced screen unit; a first opening of the spliced substrate corresponds to a spliced screen unit group, and exposes a part of a whole of the at least one spliced screen unit in the spliced screen unit group;
   a plurality of electronic devices disposed on a side of the spliced substrate away from the plurality of spliced screen units; and
   a plurality of circuit components, a circuit component in the plurality of circuit components passing through one first opening, an end of the circuit component being electrically connected to a spliced screen unit, and another end thereof being electrically connected to at least one electronic device; wherein
   the spliced screen unit includes at least one conductive line;
   the circuit component includes a second flexible printed circuit, a third flexible printed circuit, a circuit board connector and at least one driving circuit device;
   an end of the second flexible printed circuit is electrically connected to the at least one conductive line, and another end thereof is electrically connected to the circuit board connector;
   an end of the third flexible printed circuit is electrically connected to the circuit board connector, and another end thereof is electrically connected to the at least one electronic device; and
   at least one of the second flexible printed circuit and the third flexible printed circuit is detachably electrically connected to the circuit board connector, and the at least one driving circuit device is disposed on at least one of the second flexible printed circuit and the third flexible printed circuit.

2. The spliced display panel according to claim 1, further comprising:
   a plurality of first optical alignment marks disposed on a side of the spliced substrate; and
   at least one second optical alignment mark disposed on a side of each spliced screen unit proximate to the spliced substrate, wherein
   at least one first optical alignment mark in the plurality of first optical alignment marks is configured to be aligned with the at least one second optical alignment mark on the spliced screen unit in a process of arranging the spliced screen unit in a region where the spliced screen unit is to be arranged.

3. The spliced display panel according to claim 2, wherein at least a portion of the spliced substrate that is provided with the at least one first optical alignment mark thereon is transparent.

4. The spliced display panel according to claim 1, wherein an orthogonal projection of a splice gap between spliced screen units in two adjacent spliced screen unit groups on a plane does not overlap with orthogonal projections of the plurality of first openings on the plane, the plane being perpendicular to a thickness direction of the spliced substrate.

5. The spliced display panel according to claim 1, wherein the plurality of first openings are in one-to-one correspondence with the plurality of spliced screen units; and
   a center line of the first opening substantially coincides with a center line of a corresponding spliced screen unit.

6. The spliced display panel according to claim 5, wherein an orthogonal projection of a splice gap between any two adjacent spliced screen units on a plane does not overlap with orthogonal projections of the plurality of first openings on the plane, the plane being perpendicular to a thickness direction of the spliced substrate.

7. The spliced display panel according to claim 1, wherein the spliced screen unit further includes:
   a base substrate; and
   a driving circuit layer disposed on a side of the base substrate away from the spliced substrate;
   wherein
   an end of a conductive line is located on a side face of a whole of the base substrate and the driving circuit layer, and is electrically connected to the driving circuit layer of the spliced screen unit; and
   another end of the conductive line is located on a side of the base substrate away from the driving circuit layer, and is electrically connected to the circuit component.

8. The spliced display panel according to claim 7, wherein the base substrate and/or the spliced substrate are glass substrates.

9. The spliced display panel according to claim 1, wherein the plurality of first openings are in one-to-one correspondence with the plurality of spliced screen units, and a center line of the first opening substantially coincides with a center line of a corresponding spliced screen unit; an orthogonal projection of a splice gap between any two adjacent spliced screen units on a plane does not overlap with orthogonal projections of the plurality of first openings on the plane, the plane being perpendicular to a thickness direction of the spliced substrate;
   four second flexible printed circuits are disposed on a side of each spliced screen unit proximate to the spliced substrate, and each second flexible printed circuit is provided with a driving circuit device thereon;
   four third flexible printed circuits are correspondingly arranged around each first opening, and each third flexible printed circuit in the four third flexible printed circuits is electrically connected to a respective one of the four second flexible printed circuits through corresponding circuit board connectors; and
   at least one electronic device is correspondingly arranged on a side, away from the first opening, of each third flexible printed circuit in the four third flexible printed circuits.

10. The spliced display panel according to claim 1, further comprising a circuit layer disposed between the spliced substrate and the plurality of electronic devices, wherein the circuit component is electrically connected to the at least one electronic device through the circuit layer.

11. The spliced display panel according to claim 1, further comprising a plurality of first fixing components disposed between the spliced substrate and the plurality of spliced screen units, wherein the spliced screen unit is fixed to the spliced substrate through at least one first fixing component.

12. The spliced display panel according to claim 11, wherein the plurality of first fixing components include at least one of fixing adhesive tapes or magnetic attraction structures; and/or the spliced display panel comprises:

a structural frame disposed at a side of the spliced substrate away from the plurality of spliced screen units; and a plurality of second fixing components disposed between the spliced substrate and the structural frame, and fixed to the spliced substrate and the structural frame, wherein the plurality of second fixing components include at least one of fixing adhesive tapes or magnetic attraction structures.

13. The spliced display panel according to claim 1, further comprising:

a structural frame disposed at a side of the spliced substrate away from the plurality of spliced screen units; and a plurality of second fixing components disposed between the spliced substrate and the structural frame, and fixed to the spliced substrate and the structural frame.

14. The spliced display panel according to claim 13, wherein the structural frame has a plurality of second openings; and the plurality of second openings expose the plurality of electronic devices.

15. The spliced display panel according to claim 1, wherein the spliced screen unit is a mini light-emitting diode display module or a micro light-emitting diode display module.

16. The spliced display panel according to claim 1, wherein the spliced screen unit has a first actual size and a first preset size;

the first actual size is smaller than the first preset size;

a difference between the first preset size and the first actual size is a first difference, and the first difference is a sum of a size tolerance of the spliced screen unit and a spliced tolerance of the spliced screen unit.

17. The spliced display panel according to claim 1, wherein the spliced screen unit has a first actual size and a first preset size; the first actual size is smaller than the first preset size;

a difference between the first preset size and the first actual size is a second difference, and the second difference is $(A+2\times B+C)\times 2$;

the spliced substrate includes a plurality of spliced sub-substrates that are spliced to one another, and each spliced sub-substrate has a second actual size and a second preset size;

the second actual size is smaller than the second preset size; and a difference between the second preset size and the second actual size is a third difference, and the third difference is $2\times B$, wherein A is a size tolerance of a single side of the spliced screen unit, B is a size tolerance of a single side of the spliced sub-substrate, and C is an assembly tolerance between the spliced screen unit and the spliced sub-substrate.

18. A spliced display apparatus, comprising the spliced display panel according to claim 1.

\* \* \* \* \*